United States Patent
Kim et al.

(10) Patent No.: US 9,816,174 B2
(45) Date of Patent: Nov. 14, 2017

(54) VACUUM EVAPORATION HEATING ASSEMBLY AND VACUUM EVAPORATION APPARATUS HAVING THE SAME

(71) Applicant: CEKO CO., LTD., Seongnam-si (KR)

(72) Inventors: Hyun Joong Kim, Seoul (KR); Hong Chul Kim, Seoul (KR); Kyung Il Jun, Seoul (KR); Joung Rae Kim, Seoul (KR); Young Jun Hwang, Seongnam-si (KR)

(73) Assignee: CEKO Co., Ltd., Seongnam-si (KR)

( * ) Notice: Subject to any disclaimer, the term of this patent is extended or adjusted under 35 U.S.C. 154(b) by 366 days.

(21) Appl. No.: 14/112,588

(22) PCT Filed: Jul. 23, 2013

(86) PCT No.: PCT/KR2013/006595
§ 371 (c)(1),
(2) Date: May 3, 2014

(87) PCT Pub. No.: WO2014/017808
PCT Pub. Date: Jan. 30, 2014

(65) Prior Publication Data
US 2017/0088935 A1   Mar. 30, 2017

(30) Foreign Application Priority Data

Jul. 24, 2012  (KR) .................. 10-2012-0080536

(51) Int. Cl.
*C23C 16/00* (2006.01)
*C23C 14/24* (2006.01)
(Continued)

(52) U.S. Cl.
CPC ............ *C23C 14/243* (2013.01); *C23C 14/26* (2013.01); *H05B 3/03* (2013.01); *H05B 3/12* (2013.01)

(58) Field of Classification Search
CPC ...................................................... C23C 14/243
(Continued)

(56) References Cited

U.S. PATENT DOCUMENTS 3,344,505 A * 10/1967 Rively .................. C04B 37/026
                                                       219/118
5,421,896 A *  6/1995 Igarashi ................. C23C 14/26
                                                       118/726
(Continued)

FOREIGN PATENT DOCUMENTS

JP    H05-345971 A    12/1993
JP    2000-328231    11/2000
(Continued)

OTHER PUBLICATIONS

Voight, J.W. et al., "Ceramic Crucibles for Electron Bombardment Heating", The Review of Scientific Instruments, 35 (Aug. 1964), 8. 1087.

*Primary Examiner* — Keath Chen
(74) *Attorney, Agent, or Firm* — Lathrop Gage LLP

(57) ABSTRACT

The present invention is a vacuum evaporation heating assembly for heating a carrier, in which an evaporation material is filled, in a vacuum evaporation process, the vacuum evaporation heating assembly comprising: a carrier container in which the carrier is installed; and an electrode connector which extends in both directions of the carrier container to be connected to an electrode. At least one of the carrier container and the electrode connector is a plate-shaped member. The vacuum evaporation heating assembly can securely hold the carrier, in which the evaporation material is filled, and can vaporize the evaporation material in a specialized direction, thereby uniformly and efficiently evaporating the evaporation material with a small number of carriers.

4 Claims, 5 Drawing Sheets

(51) Int. Cl.
*H05B 3/12* (2006.01)
*H05B 3/03* (2006.01)
*C23C 14/26* (2006.01)

(58) Field of Classification Search
USPC .............................................. 118/726, 727
See application file for complete search history.

(56) References Cited

U.S. PATENT DOCUMENTS

| | | | | |
|---|---|---|---|---|
| 5,584,935 A | * | 12/1996 | Green | .................... C23C 14/26 |
| | | | | 118/726 |
| 2003/0101937 A1 | * | 6/2003 | Van Slyke | .............. C23C 14/12 |
| | | | | 118/726 |

FOREIGN PATENT DOCUMENTS

| | | |
|---|---|---|
| JP | 2006-111965 A | 4/2006 |
| JP | 2008-150678 | 7/2008 |
| JP | 2010-013693 | 1/2010 |
| KR | 1992-0014777 | 8/1992 |
| KR | 1020090011432 | 2/2009 |

\* cited by examiner

[Fig. 1]
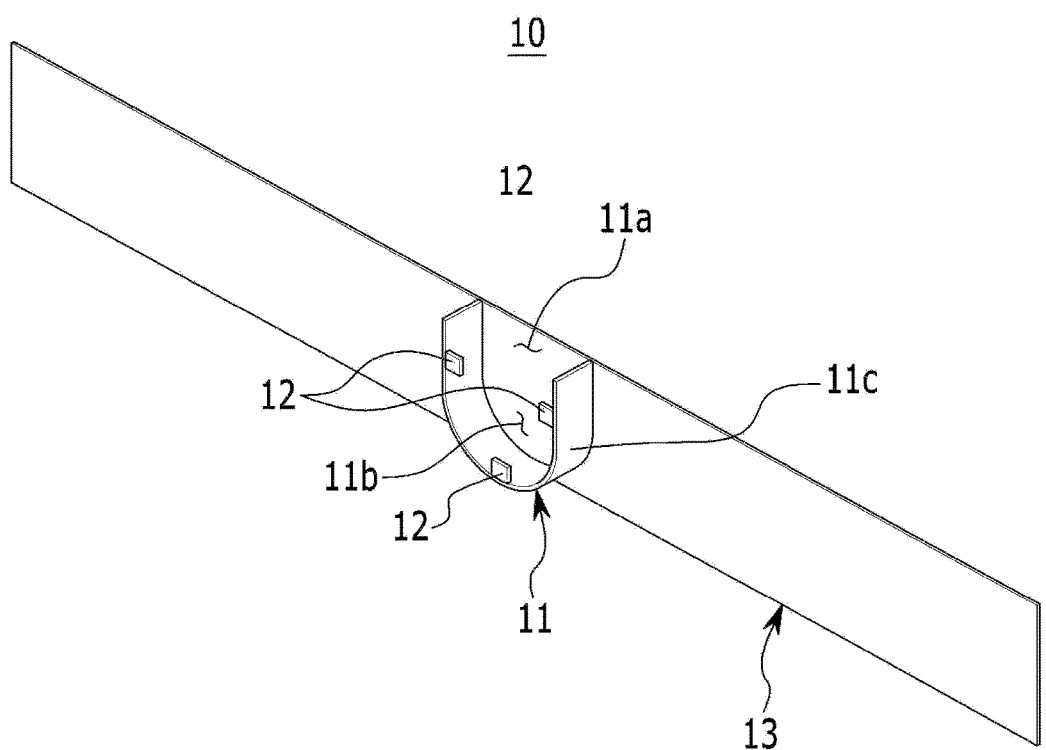

[Fig. 2]
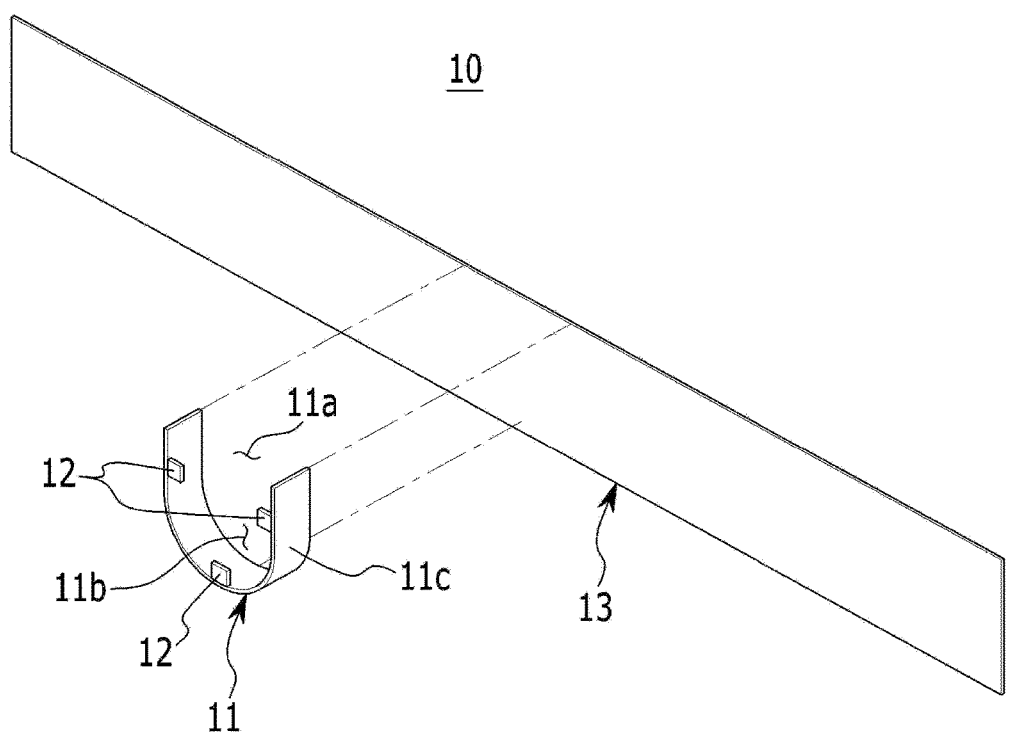

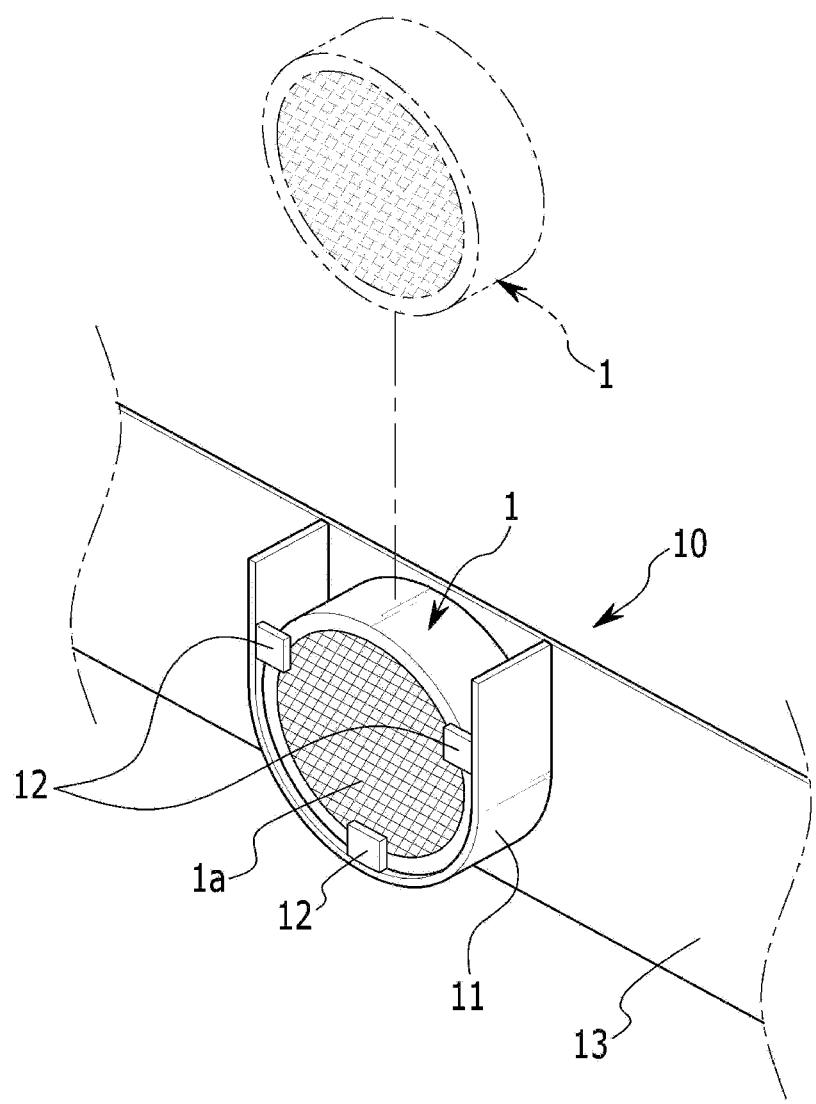

[Fig. 4]
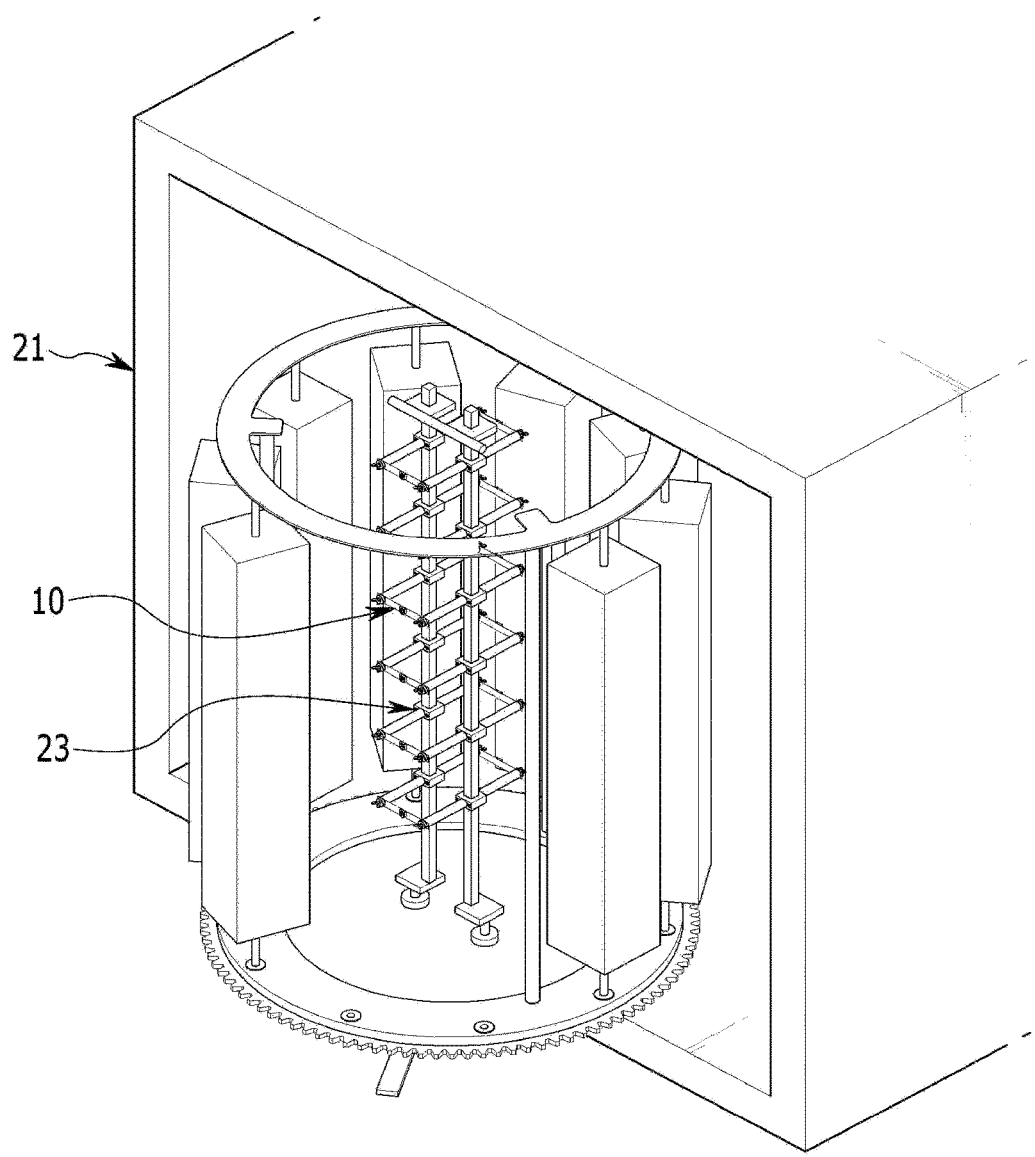

[Fig. 5]
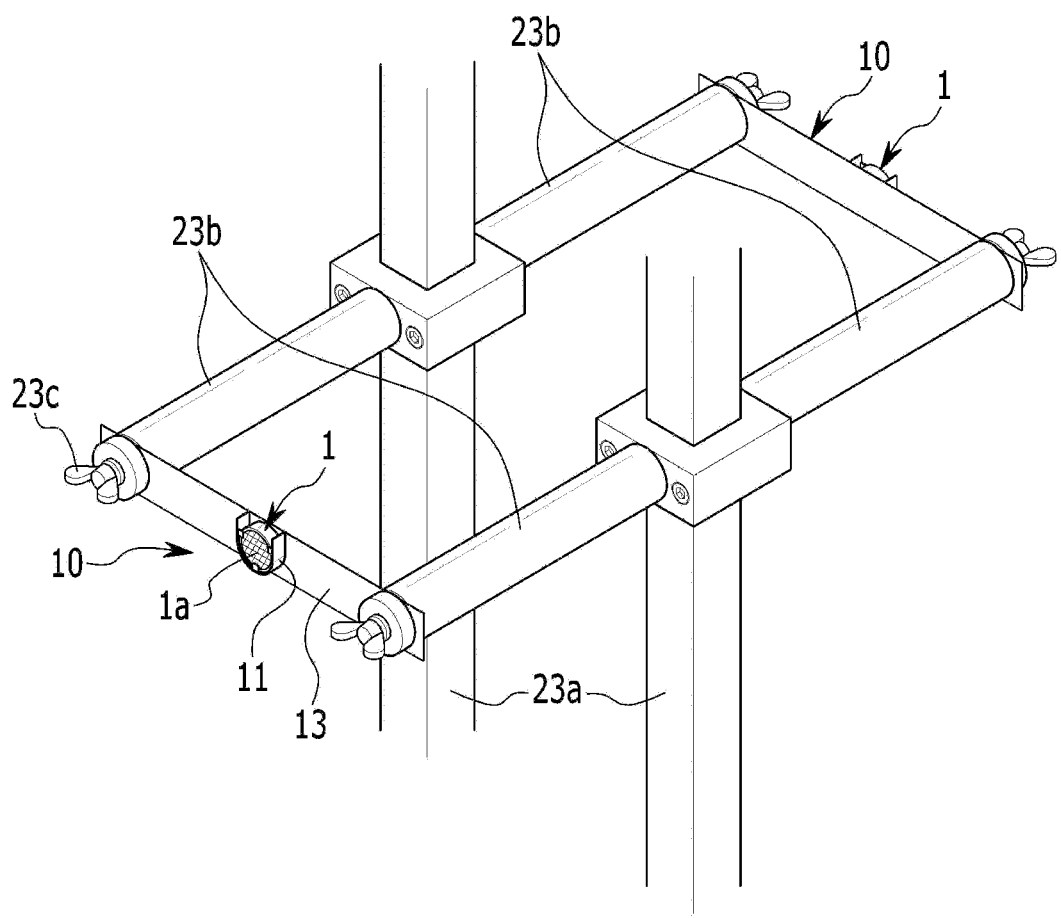

VACUUM EVAPORATION HEATING ASSEMBLY AND VACUUM EVAPORATION APPARATUS HAVING THE SAME

FIELD OF THE INVENTION

The present invention relates to a vacuum evaporation heating assembly, in particular a vacuum evaporation heating assembly and a vacuum evaporation apparatus having the same, which heat a carrier, in which an evaporation material is filled, so as to evaporate the evaporation material on an evaporation target article.

DESCRIPTION OF THE RELATED ART

In vacuum evaporation processes in the field of optical lenses (including lenses of glasses) and filters, and of portable electronics and display products such as cell phones, MP3 players, PMPs and laptop computers, there have been various attempts such as anti-reflection, optical filtering, reflectivity/absorptance control and evaporation coloring. In order to obtain various characteristics, an evaporation target article is manufactured by forming an evaporated thin layer on a substrate, which is made from glass, plastics and metals, with powders and granular materials which contain oxides such as silicon oxides, titanium oxides and zirconium oxides, fluorides such as magnesium fluorides, metals such as chromes, nickels, aluminums and SUSs, and minerals.

However, the evaporated thin layer is easily corroded or contaminated and thus is separated from the substrate since the evaporated thin layer contains metals and oxides. In order to resolve such problems, a hydrophobic layer or a water-repellent layer, which is made from organic materials, is coated on the evaporated thin layer. In order to evaporate the organic materials, a carrier, in which the organic evaporation material is filled, was used in vacuum state.

As the vacuum evaporation process, an electron beam-type vacuum evaporation process or a resistance-heating type vacuum evaporation process is used. Generally, the electron beam-type vacuum evaporation process is advantageous because its process is convenient and can be automated. However, the resistance-heating-type vacuum evaporation process is widely used due to the organic evaporation material which is usually used in the vacuum evaporation process, and the carrier in which the organic evaporation material is filled.

However, in the resistance-heating-type vacuum evaporation process, the evaporation material which is filled in the carrier is scattered when it is heated, and considerable loss of the evaporation material takes place. Therefore, the carrier has to be close to the jig of the evaporation target article, and the vacuum evaporation apparatus has to contain many carriers therein in all directions so as to maintain its evaporation performance.

SUMMARY OF THE INVENTION

Object of the Invention

The present invention is invented to resolve the above problems and provides a vacuum evaporation heating assembly to which a carrier, in which an evaporation material is filled, can be securely installed.

The present invention provides a vacuum evaporation heating assembly which can minimize the loss of an evaporation material which is filled in a carrier and can increase its evaporation efficiency.

The present invention provides a vacuum evaporation heating assembly which can minimize the number of carriers which are installed therein but nevertheless can provide uniform and efficient evaporation.

The present invention provides a vacuum evaporation apparatus comprising the above vacuum evaporation heating assembly.

Constitution of the Invention

The present invention is a vacuum evaporation heating assembly for heating a carrier, in which an evaporation material is filled, wherein the carrier is cylinder-shaped and has a first surface which has an open area, a second surface which is on the opposite side of the first surface and is closed, and a circumferential surface which connects the first surface with the second surface, the vacuum evaporation heating assembly comprising: a carrier container in which the carrier is located, wherein the carrier container is a U-shaped and plate-shaped heating element which is located such that the curved part of the U-shape faces downwards, and wherein the carrier is located in the carrier container such that the first surface of the carrier faces an evaporation target article, and the circumferential surface of the carrier contacts the curved part of the U-shape; and an electrode connector which is joined to the carrier container and is a plate-shaped element, wherein both ends of the electrode connector is connected to an electrode, wherein the carrier container is located between the electrode connector and the evaporation target article, wherein the carrier container has protrusions which cover the rim of the first surface of the carrier so as to prevent the carrier from falling from the carrier container, and wherein the electrode connector contacts the second surface of the carrier so as to heat the second surface of the carrier, and the carrier container heats the circumferential surface of the carrier.

The vacuum evaporation heating assembly is made of one of tungsten, molybdenum, nichrome, carbon and carbon fiber.

The present invention is a vacuum evaporation apparatus comprising: an evaporation chamber for a vacuum evaporation process; and the vacuum evaporation heating assembly, wherein the electrode is installed in the evaporation chamber.

Effect of the Invention

A vacuum evaporation heating assembly and a vacuum evaporation apparatus comprising the vacuum evaporation heating assembly according to the present invention have the following effects.

(1) The present invention can maximize evaporation efficiency by installing the vacuum evaporation heating assembly in an evaporative vacuum evaporation apparatus or a sputter-type vacuum evaporation apparatus in the manner that the open area of the carrier in the vacuum evaporation heating assembly faces the jig of an evaporation target article, and by inserting the carrier, in which an evaporation material is filled, into the open side of the vacuum evaporation heating assembly to concentrate the evaporation material on the evaporation target article.

(2) The present invention can make the evaporation material intensively reach the evaporation target article in only one direction with an angle of 30 degrees to 160 degrees even when the carrier is disposed in the center of the vacuum evaporation apparatus, thereby minimizing the loss of the evaporation material, maintaining its evaporation performance with the minimum number of the carriers, and reducing the costs for the evaporation material.

(3) The present invention can decrease the number of the installed carriers to less than half the number of carriers installed in a conventional vacuum evaporation apparatus, thereby facilitating the change of the carriers, saving the time for changing the carriers and increasing the efficiency for changing the carriers.

BRIEF DESCRIPTION OF THE DRAWINGS

FIG. 1 is a perspective view of a vacuum evaporation heating assembly according to the preferable embodiment of the present invention.

FIG. 2 is an exploded perspective view of the vacuum evaporation heating assembly shown in FIG. 1.

FIG. 3 is a perspective view showing that a carrier is installed in the vacuum evaporation heating assembly.

FIG. 4 is a perspective view of a vacuum evaporation apparatus having the vacuum evaporation heating assembly of the present invention.

FIG. 5 is a perspective view showing that the vacuum evaporation heating assembly of the present invention is installed on an electrode part of the vacuum evaporation apparatus.

DETAILED DESCRIPTION OF THE INVENTION

Hereinafter, the preferable embodiment of the present invention will be explained in more detail with reference to the accompanying drawings. The relevant publicly known functions or structures will not be explained in detail herein if they are not necessary to understand the gist of the present invention.

FIGS. 1 and 2 are a perspective view and an exploded perspective view of a vacuum evaporation heating assembly according to the preferable embodiment of the present invention. FIG. 3 is a perspective view showing that a carrier is installed in the vacuum evaporation heating assembly.

As shown in FIGS. 1-3, the vacuum evaporation heating assembly 10 of the present invention is formed by manufacturing a carrier container 11 and an electrode connector 13 from a plate-shaped heating element which has a thickness of 0.1 mm to 3 mm. At least one side of the carrier container 11 is open, and the carrier 1 is installed in the carrier container 11. The electrode connector 13 is joined to the carrier container 11, and both ends of the electrode connector 13 are connected to electrodes. The cylinder-shaped carrier 1 (Korean Patent Laid-Open Publication No. 10-2009-0011432), which is open in one direction 1a and has a diameter of 2 mm to 50 mm and a thickness of 1 mm to 20 mm, is inserted into the carrier container 11 and installed therein.

Preferably, the vacuum evaporation heating assembly 10 is formed by manufacturing the carrier container 11 and the electrode connector 13 from a plate-shaped heating element which has a thickness of 0.2 mm. The top side 11a and the front side 11b of the U-shaped carrier container 11 are open. The rectangular plate-shaped electrode connector 13 extends in both directions of the carrier container 11 to be connected to the electrodes. The cylinder-shaped carrier 1 has a first surface which has an open area 1a, a second surface which is on the opposite side of the first surface and is closed, and a circumferential surface which connects the first surface with the second surface, and the carrier 1 has a diameter of 10 mm to 25 mm and a thickness of 5 mm to 10 mm. The carrier 1 is inserted into the carrier container 11 through the open top side 11a of the carrier container 11 and is installed in the carrier container 11. If the size or length of the vacuum evaporation heating assembly 10 is too small or short, it is difficult to form the vacuum evaporation heating assembly 10 and also it is not easy to install the carrier 1 in the vacuum evaporation heating assembly 10. If the size or length of the vacuum evaporation heating assembly 10 is too big or long, the carrier 1 is easily separated from the vacuum evaporation heating assembly 10 and the heat deflection resulting from the heat which is generated by a resistance makes the heat transfer to the carrier 1 difficult. Therefore, it will be preferable to properly select the size or length of the vacuum evaporation heating assembly 10.

Tungsten, molybdenum, nichrome, carbons and carbon fibers may be used as the material of the vacuum evaporation heating assembly 10. Actually, tungsten is most preferable as the material of the vacuum evaporation heating assembly 10 because the price of tungsten is relatively low, the life of tungsten is long, and tungsten can be used in high temperature. The vacuum evaporation heating assembly 10 is a resistance-heating type heating element which uses the heat which is generated from the resistance to which current is applied.

The vacuum evaporation heating assembly 10 comprises the carrier container 11 and the electrode connector 13.

The carrier container 11 is located approximately in the center of the vacuum evaporation heating assembly 10 and is a member in which the carrier 1 is installed. The top side 11a of the carrier container 11 is open. The carrier 1 is inserted into the carrier container 11 through the top side 11a, and the open area 1a of the first surface of the carrier 1 faces the evaporation target article (not shown) through the front side 11b of the carrier container 11. The carrier container 11 has a side wall 11c which includes the bottom side of the carrier container 11. The side wall 11c, which is a curve-shaped heating element (i.e., a U-shaped and plate-shaped heating element), has a curved part facing downwards and surrounding the circumferential surface of the carrier 1 to heat the circumferential surface of the carrier 1. For example, the top side 11a of the carrier container 11 is open so as to allow insertion of the carrier 1 into the carrier container 11 from above, and the front side 11b of the carrier container 11 is open so that the open area 1a of the carrier 1 is exposed towards the evaporation target article which is spaced apart from the carrier 1 in a horizontal direction. The present embodiment exemplifies that the carrier 1 is inserted into the carrier container 11 through the open top side 11a of the carrier container 11, and the carrier container 11 has protrusions 12 on the side wall 11c. Each protrusion 12 is extended to cover the rim of the first surface of the carrier 1 and prevents the carrier 1, which is installed in the carrier container 11, from falling from the carrier container 11 through the open front side 11b.

The carrier container 11 is attached approximately to the center of the electrode connector 13 by a welding or inserting manner, and the electrode connector 13 is manufactured to be a rectangular plate-shaped heating element which is symmetrical to the carrier container 11. The electrode connector 13 is connected to the electrode part 23 which is connected to the electrodes and is installed in the vacuum evaporation apparatus 20 (see FIG. 4), and current is supplied to the electrode connector 13 so as to generate heat by resistance. Furthermore, the electrode connector 13 is cut from a plate to be a T-shaped plate in which the length from the horizontal end to the center of the T-shaped plate is 5 mm to 50 mm (30 mm is optimum), and the width of the vertical part of the T-shaped plate is 5 mm to 10 mm (10 mm is optimum) so as to easily secure both of the horizontal ends of the electrode connector 13 to the electrode part 23. The electrode connector 13 is attached to the carrier container 11 in the manner of closing the rear side of the carrier container 11 so as to heat the second surface of the carrier 1 which is installed in the carrier container 11.

From one to thirty vacuum evaporation heating assemblies 10 are connected to the electrode bar 23b of the electrode part 23 (see FIG. 5), which is installed on an electron beam-type or resistance-heating-type vacuum evaporation apparatus, a vertical-type or horizontal-type evaporator, or a vertical-type or horizontal-type sputter/resistance-heating-type vacuum evaporation apparatus, in series or in parallel in the manner that the open areas of the carriers of the vacuum evaporation heating assemblies face in one to four directions.

Hereinafter, the vacuum evaporation apparatus having the vacuum evaporation heating assembly of the present invention will be explained with reference to FIGS. 4 and 5.

FIG. 4 is a perspective view of the vacuum evaporation apparatus having the vacuum evaporation heating assembly of the present invention. FIG. 5 is a perspective view showing that the vacuum evaporation heating assembly of the present invention is installed on the electrode part of the vacuum evaporation apparatus.

As illustrated in FIGS. 4 and 5, the vacuum evaporation apparatus 20 of the present invention comprises an evaporation chamber 21, the electrode part 23 and the vacuum evaporation heating assembly 10.

In the evaporation chamber 21, a vacuum evaporation process is ongoing. The evaporation chamber 21 will not be explained in detail since it is publicly known.

The electrode part 23 is installed in the evaporation chamber 21 and applies current to the vacuum evaporation heating assembly 10 which is installed on the electrode part 23. The electrode part 23 comprises electrode supporters 23a which are installed vertically in the center of the evaporation chamber 21, and electrode bars 23b which extend in one direction and in the other direction from the electrode supporter 23a are vertically arranged in pairs. The electrode connector 13 of the vacuum evaporation heating assembly 10 is attached to the end of the electrode bar 23b by a screw 23c. The present embodiment exemplifies that the screw holes (not shown) are formed on both ends of the electrode connector 13 and the ends of the electrode connector 13 are attached to a pair of the electrode bars 23b by the screws 23c. However, the present invention is not limited to the present embodiment. That is, the inserting holes (not shown) may be formed on both ends of the electrode connector 13, and the protrusions (not shown) may be formed on the ends of a pair of the electrode bars 23b, thereby inserting the protrusions of the electrode bars 23b into the inserting holes of the electrode connector 13.

From one to thirty vacuum evaporation heating assemblies 10, which are connected to the electrode part 23 in series or in parallel in the manner that the open areas of the carriers 1 face in one to four directions, heats the carrier 1 in which the evaporation material is filled. The structure of the vacuum evaporation heating assembly will not be explained again since it was explained above with reference to FIGS. 1 to 3.

As explained above, the vacuum evaporation heating assembly 10 of the present invention is installed on the electrode part 23 of the evaporative vacuum evaporation apparatus 20 or the sputter-type vacuum evaporation apparatus 20 in the manner that the open front side 11b of the carrier container 11 faces the jig of the evaporation target article (not shown), and the carrier 1, in which the evaporation material is filled, is inserted into the vacuum evaporation heating assembly 10 through the open top side 11a of the vacuum evaporation heating assembly 10. Therefore, the evaporation material can be concentrated on the evaporation target article in the evaporation process, thereby maximizing its evaporation efficiency.

The present invention can make the evaporation materials intensively reach the evaporation target article only in one direction with an angle of 30 degrees to 160 degrees even when the carrier 1 is disposed in the center of the vacuum evaporation apparatus 20, thereby minimizing the loss of the evaporation material, maintaining its evaporation performance with the minimum number of the carriers 1, and reducing the costs for the evaporation material. The present invention can decrease the number of the installed carriers 1 to less than half the number of the carriers installed in a conventional vacuum evaporation apparatus, thereby facilitating the change of the carriers 1, saving the time for changing the carriers 1 and increasing its efficiency for changing the carriers 1.

The evaporation target article may be metals and glasses which are used in portable display electronics such as cell phones, smart phones, MP3 players, portable multimedia players (PMPs), digital multimedia broadcasting (DMB) receivers, navigation products, tablet PCs and laptop computers; sheet type panels made from acrylic, PC (Poly Carbonate), PMMA (Poly Methyl Methacrylate), PET (Polyethylene Terephthalate), ABS (Acrylonitrile Butadiene Styrene) copolymer and resins containing the mixtures thereof; and injection molding products such as cases, windows, keypads, functional key parts and various accessories.

The evaporation target article is installed on the vacuum evaporation apparatus 20 having the vacuum evaporation heating assembly 10. In order to prevent scratches, fingerprints and contaminations of the surface of the evaporation target article and to remove fingerprints and contaminations from the surface of the evaporation target article, the water contact angle of the surface of the evaporation target article is set to 70 degrees to 130 degrees, and the oil ($CH_2I_2$) contact angle of the surface of the evaporation target article is set to 80 degrees to 100 degrees, or the water contact angle of the surface of the evaporation target article is set to 60 degrees to 110 degrees, and the oil ($CH_2I_2$) contact angle of the surface of the evaporation target article is set to 30 degrees to 80 degrees.

Hereinafter, the method of manufacturing the vacuum evaporation heating assembly and the vacuum evaporation method using the same will be explained.

Example 1

The electrode connector is cut from a molybdenum plate having a thickness of 0.2 mm to have a width of 20 mm and a length of 100 mm to 150 mm (150 mm is optimum). The electrode connector is cut to be a T-shaped plate in which the length from the horizontal end to the center of the T-shaped plate is 5 mm to 50 mm (30 mm is optimum), and the width of the vertical part of the T-shaped plate is 5 mm to 10 mm (10 mm is optimum). The carrier container is cut from a molybdenum plate having a thickness of 0.2 mm to have a width of 5 mm and a length of 30 mm. The carrier container has toothed wheel shapes, each of which has a horizontal length of 3 mm and a vertical length of 3 mm at intervals of 3 mm on one side (i.e., rear side) of the carrier container. The carrier container has toothed wheel shapes, each of which has a horizontal length of 3 mm and a vertical length of 3 mm at intervals of 12 mm on the other side (i.e., front side) of the carrier container. The side which has the toothed wheel shapes at intervals of 3 mm is inserted into the semicircle-shaped inserting hole, which is disposed in the center of the electrode connector, and is folded downwards to secure the carrier container to the electrode connector. Then, the other side, which has the toothed wheel shapes at intervals of 12 mm, is folded in a normal direction to face inwards.

Example 2

The vacuum evaporation heating assemblies 10 manufactured in Example 1 are installed on a pair of the electrode bars 23b, which are installed on the sputter-type vacuum evaporation apparatus 20 having a diameter of 1600 mm, and are vertically arranged in three rows (high, medium and low), at each of which two vacuum evaporation heating assemblies 10 are arranged in the manner that the open front sides 11b of the carrier containers 11 face in the opposite directions. Then, the carrier 1 is inserted into the vacuum evaporation heating assembly 10 through the open top side 11a of the carrier container 11 of the vacuum evaporation heating assembly 10 in the manner that the open area 1a faces the evaporation target article.

The evaporation target article, which is made from glass, is installed on a jig, and argon gas is introduced into the vacuum evaporation apparatus 20 when the vacuum evaporation apparatus 20 has a high vacuum state of $1.5 \times 10^{-5}$ torr. Then, plasma is activated with the power of 0.3 KW for 600 seconds so as to make the vacuum evaporation apparatus 20 have the vacuum state of $2.2 \times 10^{-2}$ torr. Then, the surface of the evaporation target article is activated. Using an Si target, oxygen gas and argon gas are applied with the power of 4.5 KW for 180 seconds so as to make the vacuum evaporation apparatus 20 have the vacuum state of $1.5 \times 10^{-3}$ torr, thereby generating an $SiO_2$ layer.

A voltage of 3.5 V and a current of 288 A are applied to the evaporation heating assembly 10 of the present invention, into which the carrier 1, in which an anti-fingerprint and anti-contamination coating agent is filled, is inserted, whereby the evaporation material from the heated carrier 1 is evaporated on the evaporation target article for 240 seconds.

Table 1 shows the contact angle and durability of the evaporation target article which is evaporated by the anti-fingerprint and anti-contamination coating agent.

TABLE 1

| Sample | Initial angle ($H_2O$) | Initial angle ($CH_2I_2$) | Wear-resistance ($H_2O$) | Chemical-resistance ($H_2O$) | Salt water ($H_2O$) |
|---|---|---|---|---|---|
| Row 1 (High) | 116.2 | 96.7 | 113.1 | 115.1 | 115.3 |
| Row 2 (Medium) | 117.2 | 96.5 | 112.6 | 115.2 | 115.1 |
| Row 3 (Low) | 116.8 | 97.2 | 113.2 | 115.4 | 115.5 |

Example 3

Using the method explained in Example 2, a voltage of 3.5 V and a current of 288 A are applied to the evaporation heating assembly 10 of the present invention, into which the carrier 1, in which the coating agent having good fingerprint visibility is filled, is inserted, whereby the evaporation material from the heated carrier 1 is evaporated on the evaporation target article for 240 seconds. Table 2 shows the contact angle and durability of the evaporation target article which is evaporated by the coating agent having good fingerprint visibility.

TABLE 2

| Sample | Initial angle ($H_2O$) | Initial angle ($CH_2I_2$) | Wear-resistance ($H_2O$) | Chemical-resistance ($H_2O$) | Salt water ($H_2O$) |
|---|---|---|---|---|---|
| Row 1 (High) | 81.2 | 39.4 | 74.5 | 72.3 | 75.1 |
| Row 2 (Medium) | 81.3 | 39.5 | 74.5 | 72.5 | 74.4 |
| Row 3 (Low) | 81.4 | 42.4 | 73.4 | 71.3 | 75.5 |

REFERENCE NUMERALS

10: Evaporation heating assembly
11: Carrier container
13: Electrode connector
20: Vacuum evaporation apparatus
21: Evaporation chamber
23: Electrode part

The invention claimed is:

1. A vacuum evaporation heating assembly for heating a carrier, in which an evaporation material is filled, wherein the carrier is cylinder-shaped and has a first surface which has an open area, a second surface which is on the opposite side of the first surface and is closed, and a circumferential surface which connects the first surface with the second surface, the vacuum evaporation heating assembly comprising:
a carrier container in which the carrier is located, wherein the carrier container is a U-shaped and plate-shaped heating element which is located such that a curved part of the U-shape faces downwards, and wherein the carrier is located in the carrier container such that the first surface of the carrier faces an evaporation target article, and the circumferential surface of the carrier contacts the curved part of the U-shape; and
an electrode connector which is joined to the carrier container and is a plate-shaped element, wherein each of two ends of the electrode connector are connected to an electrode,
wherein the carrier container is located between the electrode connector and the evaporation target article,
wherein the carrier container has protrusions which cover a rim of the first surface of the carrier so as to prevent the carrier from falling from the carrier container, and
wherein the electrode connector contacts the second surface of the carrier so as to heat the second surface of the carrier, and the carrier container heats the circumferential surface of the carrier.

2. The vacuum evaporation heating assembly according to claim 1, wherein the vacuum evaporation heating assembly is made of one of tungsten, molybdenum, nichrome, carbon and carbon fiber.

3. The vacuum evaporation heating assembly of claim 2, further comprising:

an evaporation chamber for a vacuum evaporation process; wherein the electrode includes a plurality of electrodes;
wherein the electrodes are installed in the evaporation chamber.

4. The vacuum evaporation heating assembly of claim 1, further comprising:
an evaporation chamber for a vacuum evaporation process; wherein the electrode includes a plurality of electrodes;
wherein the electrodes are installed in the evaporation chamber.

\* \* \* \* \*